(12) United States Patent
Oganesian et al.

(10) Patent No.: US 10,199,519 B2
(45) Date of Patent: Feb. 5, 2019

(54) METHOD OF MAKING A SENSOR PACKAGE WITH COOLING FEATURE

(71) Applicant: Optiz, Inc., Palo Alto, CA (US)

(72) Inventors: Vage Oganesian, Sunnyvale, CA (US); Zhenhua Lu, Suzhou (CN)

(73) Assignee: OPTIZ, INC., Palo Alto, CA (US)

( * ) Notice: Subject to any disclaimer, the term of this patent is extended or adjusted under 35 U.S.C. 154(b) by 0 days.

(21) Appl. No.: 15/944,466

(22) Filed: Apr. 3, 2018

(65) Prior Publication Data

US 2018/0226517 A1    Aug. 9, 2018

Related U.S. Application Data

(62) Division of application No. 15/290,522, filed on Oct. 11, 2016, now Pat. No. 9,972,730, which is a division
(Continued)

(51) Int. Cl.
*H01L 21/00* (2006.01)
*H01L 31/024* (2014.01)
(Continued)

(52) U.S. Cl.
CPC .......... *H01L 31/024* (2013.01); *H01L 21/481* (2013.01); *H01L 23/13* (2013.01); *H01L 23/367* (2013.01); *H01L 23/467* (2013.01); *H01L 23/49833* (2013.01); *H01L 24/16* (2013.01); *H01L 24/17* (2013.01); *H01L 24/73* (2013.01); *H01L 25/18* (2013.01); *H01L 27/1446* (2013.01); *H01L 31/02002* (2013.01);
(Continued)

(58) Field of Classification Search
None
See application file for complete search history.

(56) References Cited

U.S. PATENT DOCUMENTS 5,578,525 A     11/1996  Mizukoshi
6,424,026 B1 *   7/2002  Mangtani ................ H01L 23/24
                                                    257/675
(Continued)

FOREIGN PATENT DOCUMENTS

KR    1020120018713 A    3/2012
KR    1020130056161 A    5/2013
KR    1020130083846 A    7/2013

*Primary Examiner* — Hung Vu
(74) *Attorney, Agent, or Firm* — DLA Piper LLP (US)

(57) ABSTRACT

A sensor device includes a first substrate of semiconductor material having opposing first and second surfaces, photodetectors configured to receive light impinging on the first surface, and first contact pads each exposed at both the first and second surfaces and electrically coupled to at least one of the photodetectors. A second substrate comprises opposing first and second surfaces, electrical circuits, a second contact pads each disposed at the first surface of the second substrate and electrically coupled to at least one of the electrical circuits, and a plurality of cooling channels formed as first trenches extending into the second surface of the second substrate but not reaching the first surface of the second substrate. The first substrate second surface is mounted to the second substrate first surface such that each of the first contact pads is electrically coupled to at least one of the second contact pads.

6 Claims, 12 Drawing Sheets

Related U.S. Application Data of application No. 14/551,262, filed on Nov. 24, 2014, now Pat. No. 9,496,297.

(60) Provisional application No. 61/912,476, filed on Dec. 5, 2013.

(51) Int. Cl.

| | | |
|---|---|---|
| *H01L 27/144* | (2006.01) | |
| *H01L 23/13* | (2006.01) | |
| *H01L 23/367* | (2006.01) | |
| *H01L 23/467* | (2006.01) | |
| *H01L 21/48* | (2006.01) | |
| *H01L 23/498* | (2006.01) | |
| *H01L 23/00* | (2006.01) | |
| *H01L 25/18* | (2006.01) | |
| *H01L 31/02* | (2006.01) | |

(52) U.S. Cl.
CPC .. *H01L 31/02005* (2013.01); *H01L 31/02019* (2013.01); *H01L 23/3672* (2013.01); *H01L 23/3677* (2013.01); *H01L 2224/16145* (2013.01); *H01L 2224/16225* (2013.01); *H01L 2224/17181* (2013.01); *H01L 2224/48091* (2013.01); *H01L 2224/73257* (2013.01); *H01L 2924/00* (2013.01); *H01L 2924/0002* (2013.01); *H01L 2924/12043* (2013.01); *H01L 2924/1433* (2013.01)

(56) References Cited

U.S. PATENT DOCUMENTS

| | | | |
|---|---|---|---|
| 6,627,864 B1 | 9/2003 | Glenn | |
| 6,777,767 B2 | 8/2004 | Badehi | |
| 6,972,480 B2 | 12/2005 | Zilber et al. | |
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,456,901 B2 | 11/2008 | Jeong et al. | |
| 7,495,341 B2 | 2/2009 | Zilber et al. | |
| 7,550,319 B2 * | 6/2009 | Wang | C03C 8/02 257/432 |
| 7,569,409 B2 | 8/2009 | Lin et al. | |
| 7,589,422 B2 | 9/2009 | Lee et al. | |
| 7,642,629 B2 | 1/2010 | Zilber et al. | |
| 7,664,390 B2 | 2/2010 | Cho et al. | |
| 7,859,033 B2 | 12/2010 | Brady | |
| 8,183,579 B2 | 5/2012 | Wang | |
| 8,432,011 B1 | 4/2013 | Oganesian | |
| 8,546,900 B2 | 10/2013 | Oganesian | |
| 8,546,951 B2 | 10/2013 | Oganesian | |
| 8,552,518 B2 | 10/2013 | Oganesian | |
| 8,570,669 B2 | 10/2013 | Oganesian | |
| 8,604,576 B2 | 12/2013 | Oganesian | |
| 8,692,344 B2 | 4/2014 | Oganesian | |
| 8,759,930 B2 | 6/2014 | Oganesian | |
| 8,796,800 B2 | 8/2014 | Oganesian | |
| 8,921,759 B2 | 12/2014 | Oganesian | |
| 9,018,725 B2 | 4/2015 | Oganesian | |
| 9,041,840 B2 * | 5/2015 | Borthakur | H04N 5/335 348/302 |
| 9,233,511 B2 | 1/2016 | Oganesian | |
| 9,893,218 B2 | 2/2018 | Oganesian | |
| 2004/0075167 A1 | 4/2004 | Nurnus | |
| 2004/0251525 A1 | 12/2004 | Zilber | |
| 2005/0051859 A1 | 3/2005 | Hoffman | |
| 2005/0090050 A1 | 4/2005 | Shim | |
| 2005/0104179 A1 | 5/2005 | Zilber | |
| 2005/0104186 A1 | 5/2005 | Yang | |
| 2005/0205977 A1 | 9/2005 | Zilber | |
| 2006/0124953 A1 | 6/2006 | Negley | |
| 2007/0138498 A1 | 6/2007 | Zilber | |
| 2007/0190691 A1 | 8/2007 | Humpston | |
| 2007/0190747 A1 | 8/2007 | Humpston | |
| 2008/0012115 A1 | 1/2008 | Zilber | |
| 2008/0017879 A1 | 1/2008 | Zilber | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116544 A1 | 5/2008 | Grinman | |
| 2008/0116545 A1 | 5/2008 | Grinman | |
| 2008/0150121 A1 | 6/2008 | Oganesian | |
| 2008/0246136 A1 | 10/2008 | Haba | |
| 2008/0265350 A1 | 10/2008 | Wu et al. | |
| 2009/0115047 A1 | 5/2009 | Haba | |
| 2009/0160065 A1 | 6/2009 | Haba | |
| 2009/0212381 A1 | 8/2009 | Crisp | |
| 2010/0053407 A1 | 3/2010 | Crisp | |
| 2010/0225006 A1 | 9/2010 | Haba | |
| 2010/0230812 A1 | 9/2010 | Oganesian | |
| 2010/0237452 A1 | 9/2010 | Hagiwara et al. | |
| 2010/0309635 A1 * | 12/2010 | Sasaki | H01L 23/3677 361/719 |
| 2011/0012259 A1 | 1/2011 | Grinman | |
| 2011/0024610 A1 | 2/2011 | Tu | |
| 2011/0031629 A1 | 2/2011 | Haba | |
| 2011/0033979 A1 | 2/2011 | Haba | |
| 2011/0049696 A1 | 3/2011 | Haba | |
| 2011/0108940 A1 | 5/2011 | Huang et al. | |
| 2011/0187007 A1 | 8/2011 | Haba | |
| 2012/0018863 A1 | 1/2012 | Oganesian | |
| 2012/0018868 A1 | 1/2012 | Oganesian | |
| 2012/0018893 A1 | 1/2012 | Oganesian | |
| 2012/0018894 A1 | 1/2012 | Oganesian | |
| 2012/0018895 A1 | 1/2012 | Oganesian | |
| 2012/0020026 A1 | 1/2012 | Oganesian | |
| 2012/0043635 A1 | 2/2012 | Yang | |
| 2012/0068327 A1 | 3/2012 | Oganesian | |
| 2012/0068330 A1 | 3/2012 | Oganesian | |
| 2012/0068351 A1 | 3/2012 | Oganesian | |
| 2012/0068352 A1 | 3/2012 | Oganesian | |
| 2013/0056844 A1 | 3/2013 | Oganesian | |
| 2013/0168791 A1 | 7/2013 | Oganesian | |
| 2013/0249031 A1 | 9/2013 | Oganesian | |
| 2013/0280864 A1 | 10/2013 | Bachman | |

* cited by examiner

METHOD OF MAKING A SENSOR PACKAGE WITH COOLING FEATURE

RELATED APPLICATIONS

This application is a divisional of U.S. patent application Ser. No. 15/290,522, filed Oct. 11, 2016, which is a divisional of U.S. patent application Ser. No. 14/551,262, filed Nov. 24, 2014, which claims the benefit of U.S. Provisional Application No. 61/912,476, filed Dec. 5, 2013, which are incorporated herein by reference.

FIELD OF THE INVENTION

The present invention relates to packaging of microelectronic sensor devices such as photonic sensors or accelerometers in a single package with their ASIC processors in a manner that is compact yet provides improved cooling capabilities.

BACKGROUND OF THE INVENTION

As the semiconductor industry pushes for more density and performance, IC stacking structures have become a prominent solution. However, the IC package in stacking structures tends to run much hotter.

A conventional chip stacking technique is disclosed in U.S. Patent Publication 2013/0280864, which stacks the IC chip on an interposer. To solve the thermal issues, a stand-alone heat sink is attached over the top of the package. Attaching a heat sink over the semiconductor package has been a standard solution used for IC cooling. However, this solution is bulky and is not viable for sensor packages because the sensor active area needs to be exposed to the environment (i.e. for receiving what is being sensed—e.g. incoming light). Placing a heat sink over the package would block and seal away the sensor active area preventing its proper operation.

There is a need for a low profile technique for stacking IC chips such as a sensor device over associated ASIC semiconductor wafer (e.g. the sensor's processor unit) which includes a cooling solution all within a single package.

BRIEF SUMMARY OF THE INVENTION

The aforementioned problems and needs are addressed by a method of forming a sensor device comprises providing first, second and third substrates. The first substrate of semiconductor material comprises opposing first and second surfaces, a plurality of photodetectors configured to receive light impinging on the first surface, and a plurality of first contact pads each electrically coupled to at least one of the plurality of photodetectors. The second substrate comprises opposing first and second surfaces, electrical circuits, and a plurality of second contact pads each electrically coupled to at least one of the electrical circuits. The method includes forming a plurality of first trenches into the second surface of the second substrate but not reaching the first surface of the second substrate, and mounting the second surface of the first substrate to the first surface of the second substrate. The third substrate comprises opposing first and second surfaces, a plurality of third contact pads disposed at the first surface of the third substrate, and a plurality of fourth contact pads disposed at the first surface of the third substrate. The method further comprises mounting the first surface of the third substrate to the second surface of the second substrate such that each of the second contact pads is electrically coupled to at least one of the third contact pads, and electrically connecting a plurality of wires between the first contact pads and the fourth contact pads.

Other objects and features of the present invention will become apparent by a review of the specification, claims and appended figures.

DETAILED DESCRIPTION OF THE INVENTION

The present invention is a low profile method and structure for stacking a sensor device over its processor unit, while providing a cooling solution, all within a single package. FIGS. 1-9 illustrate the steps in forming the packaged sensor device with integrated cooling solution.

Figure 1:
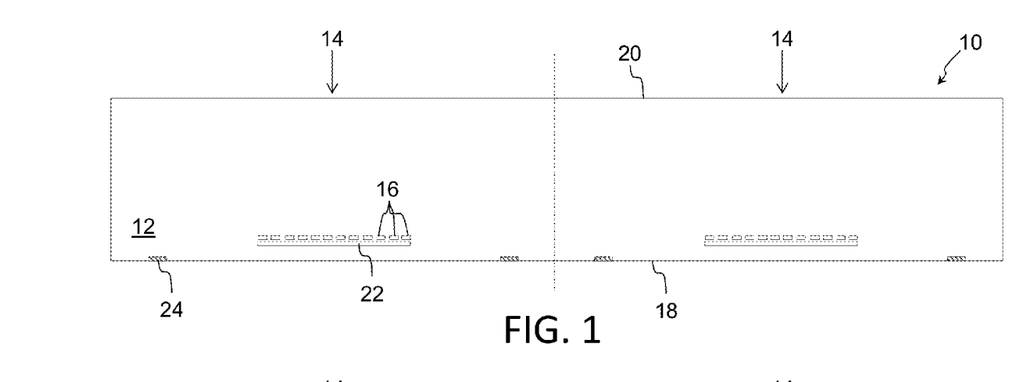
FIGS. 1-9 are side cross sectional views showing the steps in forming the packaged sensor device with an integrated cooling solution.

The process begins by providing a backside illuminated sensor wafer 10, which is well known in the art. One example is shown in FIG. 1, which includes a substrate 12 with sensor active areas 14 containing photo detectors 16 at or near the substrate's front surface 18. The photo detectors 16 are configured to receive light through the back side (i.e. through the back surface 20) of the substrate 12 and generate an electrical signal in response to that received light. The sensor wafer 10 also includes supporting circuitry 22 and sensor pads 24 at the front surface 18 that are connected to the photo detectors 16 and/or supporting circuitry 22 for providing the electrical signals from the photo detectors 16 to the outside world. Multiple sensors (each with its own photo detectors 16, supporting circuitry 22 and sensor pads 24) are formed on the same wafer 10 (two such sensors are shown in FIG. 1).

Figure 2:
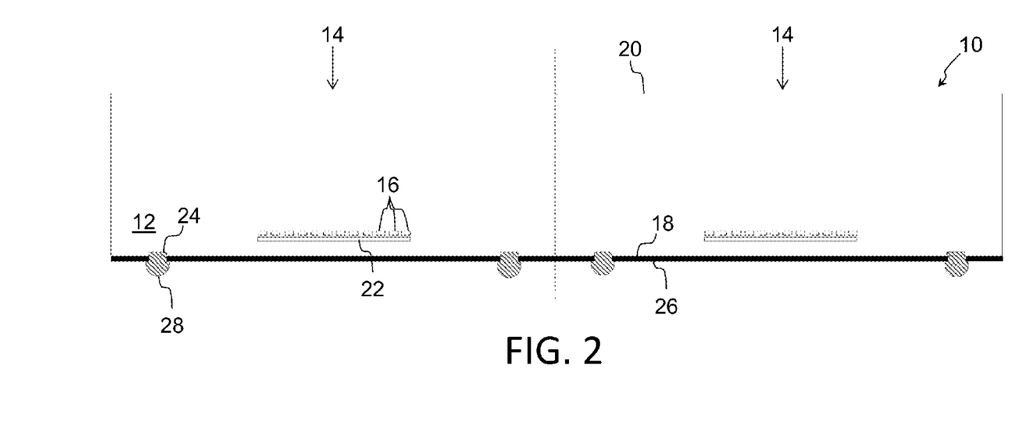

An insulation (passivation) layer 26 such as silicon dioxide (oxide) or silicon nitride (nitride) is formed on the front surface 18 of substrate 12. Preferably, the passivation layer 26 is made of silicon dioxide of at least 0.5 µm in thickness. Silicon dioxide deposition can be Chemical Vapor Deposition (CVD), sputtering, or any another appropriate deposition method(s). The portions of passivation layer 26 over the sensor pads 24 are selectively removed with appropriate photolithography masking (i.e. photoresist deposition, mask exposure and selective removal) and plasma etching techniques. If passivation layer 26 is silicon dioxide, then the etchant can be CF4, SF6, NF3 or any other appropriate etchant. If passivation layer 26 is silicon nitride, then the etchant can be CF4, SF6, NF3, CHF3 or any other appropriate etchant. An interconnect 28 is then attached to each of the exposed sensor pads 24. The interconnects 28 can be a Ball Grid Array (BGA), a polymer bump, a copper pillar or any other appropriate interconnect component that is well known in the art. Copper pillar or BGA (as shown) are preferred choices for interconnects 28. The resulting sensor wafer structure is shown in FIG. 2.

Figure 3:
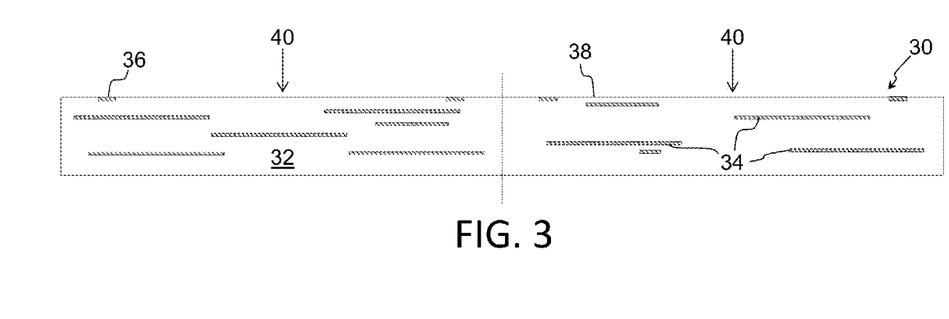

An ASIC wafer 30 is provided, as shown in FIG. 3. ASIC wafer 30 includes a substrate 32 that contains electrical circuits 34 which are electrically connected to bond pads 36 disposed on the top surface 38 of the substrate 32. The ASIC wafer substrate 32 is preferably made of silicon. Multiple ASIC dies 40 are formed on the same substrate 32 (two such dies are generically represented in FIG. 3). The ASIC wafer 30 can have a single layer of electrical circuits 34, or multiple layers of electrical circuits 34 within the substrate 32. Electrical circuits 34 can be conductive traces, electrical devices, both, etc.

Figure 4:
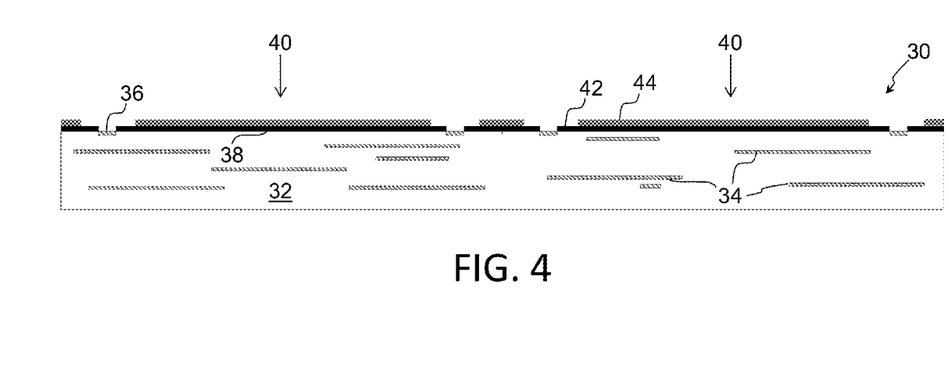

An insulation (passivation) layer 42 such as silicon dioxide or silicon nitride is formed over the top surface 38 of the ASIC wafer 30. Preferably, this passivation layer 42 is made of silicon dioxide with a thickness of at least 0.5 μm. Silicon dioxide deposition can be Plasma Enhanced Chemical Vapor Deposition (PECVD), Chemical Vapor Deposition (CVD), or any another appropriate deposition method(s). The portions of passivation layer 42 over the bond pads 36 are selectively removed with appropriate photolithography masking (i.e. photoresist deposition, mask exposure and selective removal) and plasma etching techniques. If passivation layer 42 is silicon dioxide, then the etchant can be CF4, SF6, NF3 or any other appropriate etchant. If passivation layer 42 is silicon nitride, then the etchant can be CF4, SF6, NF3, CHF3 or any other appropriate etchant. A supportive layer 44 is then formed over passivation layer 42. Supportive layer 44 can be polymer or glass. Preferably, supportive layer 44 is a type of photo reactive liquid polymer deposited over the passivation layer 42 by spray deposition. Portions of the supportive layer 44 over and adjacent to the bond pads 36 are selectively removed, preferably using photolithography etching (i.e. the bond pads 36 are exposed as well as portions of passivation layer 42 around the bond pads 36, leaving a stepping of layers). The resulting structure ASIC wafer structure is shown in FIG. 4.

Figure 5:
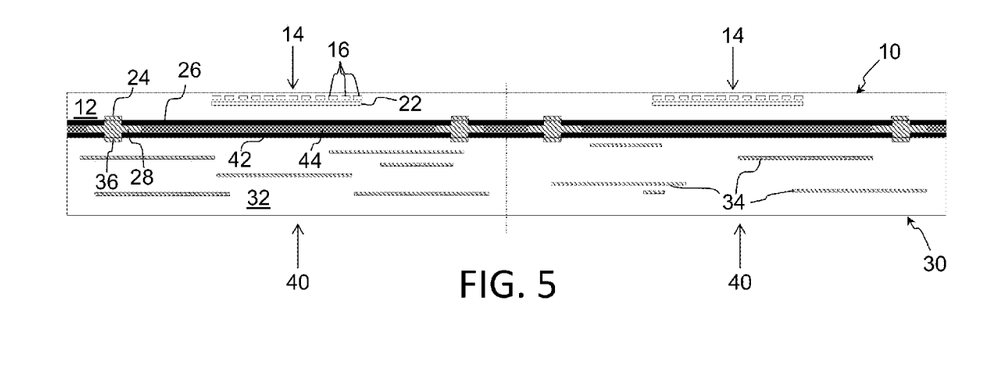

The sensor wafer 10 and the ASIC wafer 30 are bonded together (i.e. front surface 18 bonded to top surface 38) using thermal compression or thermal sonic techniques that are well known in the art. An optional layer of adhesive can be deposited over the supportive layer 44 on the ASIC wafer 30 by roller before bonding. After compression, corresponding ones of the bond pads 36 and sensor pads 24 are electrically connected by the corresponding interconnect 28. Silicon thinning can then be performed by mechanical grinding, chemical mechanical polishing (CMP), wet etching, atmospheric downstream plasma (ADP), dry chemical etching (DCE), or a combination of aforementioned processes or any another appropriate silicon thinning method(s) applied to back surface 20 to reduce the thickness of substrate 12 (i.e. reduce the amount of silicon over the photo detectors 16). The resulting structure is shown in FIG. 5.

Figure 6:
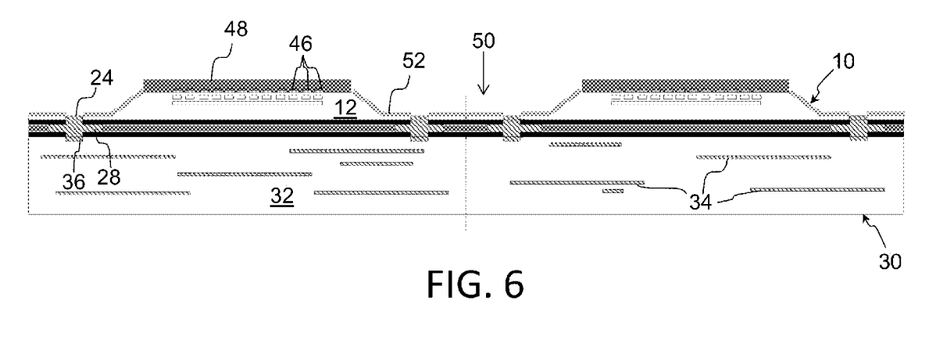

An optional optical layer can be deposited over the active areas 14. For example, the optical layer can include light manipulation elements such as color filters and microlenses 46. A protective layer 48 is depostied over the active side of the sensor wafer 10 covering the active areas 14. A preferred protective layer 48 is protective tape. Portions of the protective tape 48 are selectively removed (e.g. using photolithography, a laser, etc.) thus exposing portions of the substrate 12 between the active areas 14. An anisotropic dry etch is used to form trenches 50 into the exposed surface of the substrate 12 between the active areas 14. The enchant can be CF4, SF6, NF3, Cl2, CCl2F2 or any other appropriate etchant. The trenches 50 extend down to and expose the sensor pads 24. Another passivation layer 52 is deposited on the back side of the sensor wafer 10. Preferably, passivation layer 52 is made of silicon dioxide with a thickness of at least 0.5 μm, using silicon dioxide deposition such as Chemical Vapor Deposition (CVD), sputtering or any another appropriate deposition method(s). Portions of the passivation layer 52 over the protective tape 48 and sensor pads 24 are removed with appropriate photo lithography masking and plasma etching techniques that are well known in the art. If passivation 52 is silicon dioxide, then etchant can be CF4, SF6, NF3 or any other appropriate etchant. If passivation 52 is silicon nitride, then etchant can be CF4, SF6, NF3, CHF3 or any other appropriate etchant. The resulting structure is shown in FIG. 6.

Figure 7:
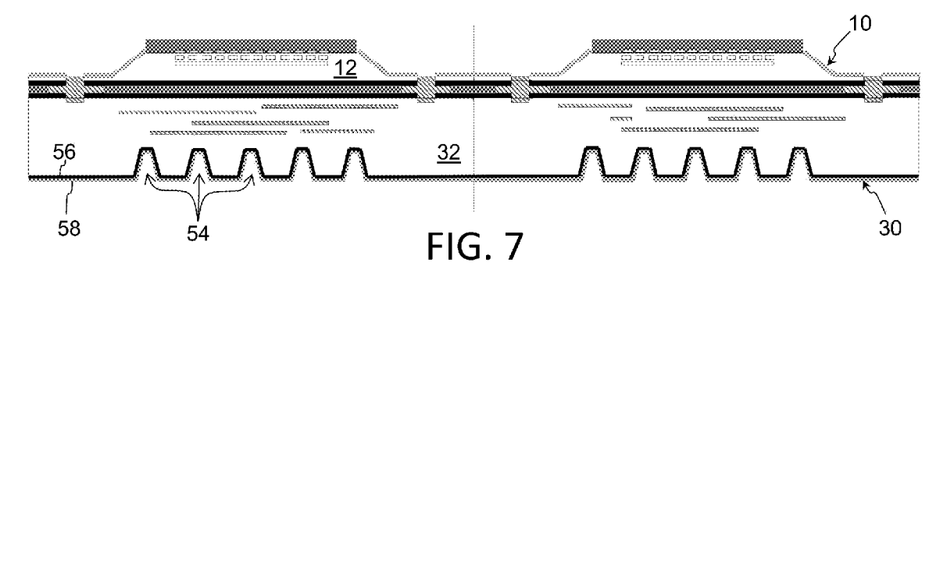

A layer of photoresist is deposited on the bottom surface of the ASIC wafer substrate 32, and patterned via photolithography to expose selective portions of substrate 32. The pattern formed in the photoresist depends on the design of the cooling channels to be formed, and can have many numbers of variations depending on the preferred design specification. The pattern in the photoresist will dictate how the ASIC wafer substrate is etched to increase its surface area thus increasing its cooling capability. One preferred pattern is intersecting rows and columns of lines. An anisotropic dry etch is used to form trenches 54 into the exposed portions of the bottom surface of the ASIC wafer substrate 32. The enchant can be CF4, SF6, NF3, Cl2, CCl2F2 or any other appropriate etchant. The walls of the trenches 54 can be vertical or can be tapered. The trenches 54 form cooling channels that extend into the bottom surface of the substrate 32. After the photoresist is stripped, an optional diffusion material 56 such as silicon nitride can be formed on the bottom surface of substrate 32 (including in trenches 50). This can be followed by forming an optional highly thermally conductive material(s) 58 on the bottom surface of substrate 32 (including in trenches 50). The highly thermally conductive material layer 58 formed on the diffusion material layer 56 is preferably one or more metals (preferably both titanium and copper), which are deposited by Physical Vapor Deposition (PVD). The resulting structure is shown in FIG. 7.

Figure 8:
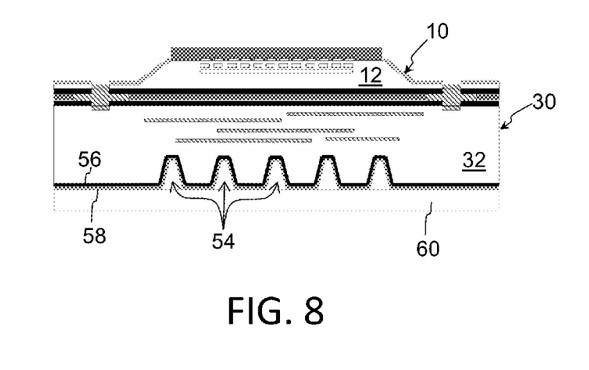

The cooling channels formed by trenches 54 can be transformed into cooling tunnels by covering them with a substrate 60. The substrate 60 could be any appropriate structure or thin film bonded to the bottom surface of the ASIC wafer substrate 32. For example, the substrate 60 could be die attached tape, a metallic foil or a silicon wafer. These cooling tunnels can be used to direct air flow to the sides of the package for heat dissipation. Wafer level dicing/ singulation of components can be done with mechnical blade dicing equipment, laser cutting or any other apporiate processes along scribe lines between active areas 14, resulting in separate sensor packages each containing a sensor wafer die with its own active area, as illustrated in FIG. 8.

Figure 9:
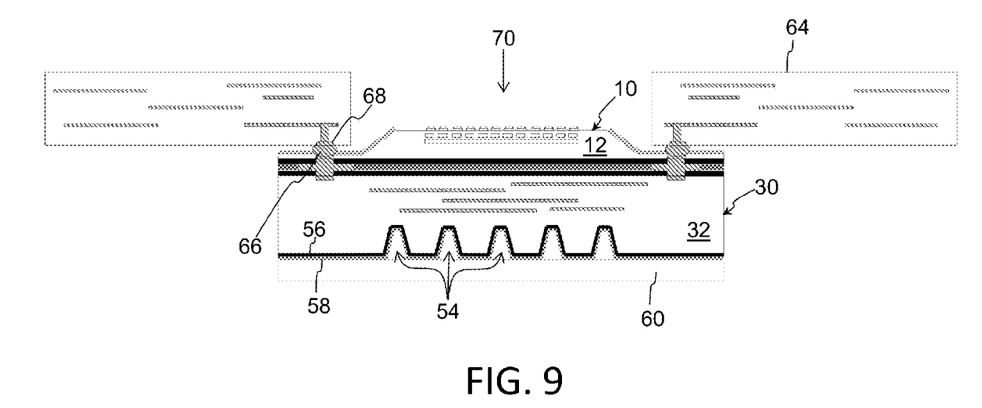

The individual sensor packages can be mounted to a host device such as an interposer, a printed circuit board or flex printed circuit board. As shown in FIG. 9, the sensor package is connected to a printed circuit board (PCB) 64 by interconnects 66 that make an electrical connection between the sensor wafer bond pads 24 and bond pads 68 of the PCB 64. The PCB 64 preferably includes an aperture or window 70 that allows the sensor's active area to be exposed to incoming light. The electrical interconnects 66 between the host and sensor package could be a ball grid array, copper pillars, adhesive bumps or any other bonding techniques that are appropriate. An optional underfill can be deposited around the sensor package after it is mounted. FIG. 9 shows the final structure after the protective tape is removed. Air flowing through the cooling tunnels 54 efficiently removes heat from the package (originating from the sensor wafer die 30 and flowing to the ASIC wafer die 10), given the expanded surface area of the bottom surface of the ASIC die 10 because of the cooling tunnels.

Figure 10:
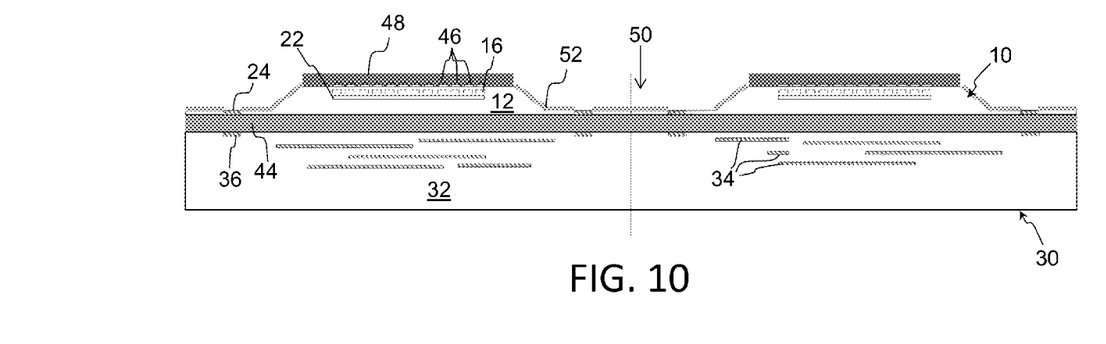
FIGS. 10-13 are side cross sectional views showing the steps in forming an alternate embodiment of the packaged sensor device with an integrated cooling solution.
Figure 11:
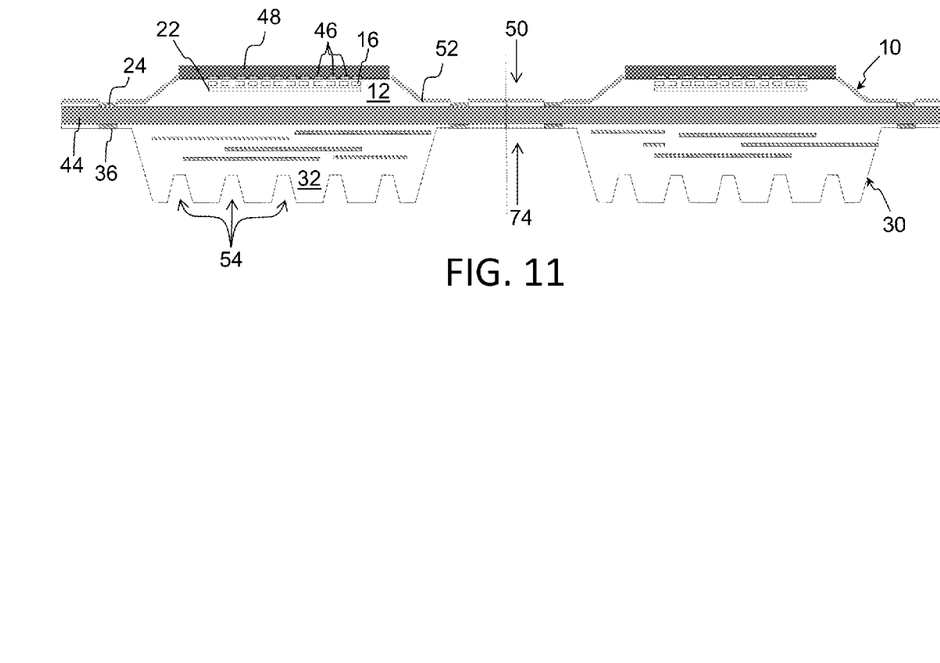

FIGS. 10-13 illustrate the steps in forming an alternate embodiment of the packaged sensor device with integrated cooling solution. The process begins with the same processing steps as described above with respect to FIGS. 1-6, except without passivation layers 26 and 42, without interconnects 28, and without patterning the supportive layer 44, so that wafers 10 and 30 are bonded together without sensor pads 24 being electrically connected to bond pads 36, as shown in FIG. 10.

Trenches 54 are formed into the bottom surface of the ASIC wafer substrate 32 as described above. A layer of photoresist is then deposited on the bottom surface of the ASIC wafer substrate 32, and patterned via photolighography to remove those portions of the photoresist between the sets of cooling channels (i.e. those portions near the scribe lines), leaving portions of the bottom surface of the ASIC wafer exposed. An anisotropic dry etch is used to form trenches 74 in the exposed portions of the ASIC wafer bottom surface. The enchant can be CF4, SF6, NF3, Cl2, CCl2F2 or any other appropriate etchant. The trenches 74 extend to and expose bond pads 36. The walls of the trenches 74 can be vertical or tapered. The photoresist is then removed, resulting in the structure shown in FIG. 11.

Figure 12:
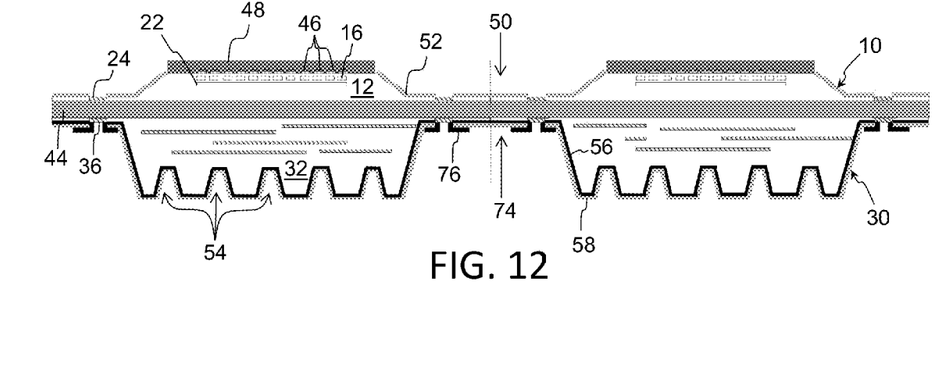
Figure 13:
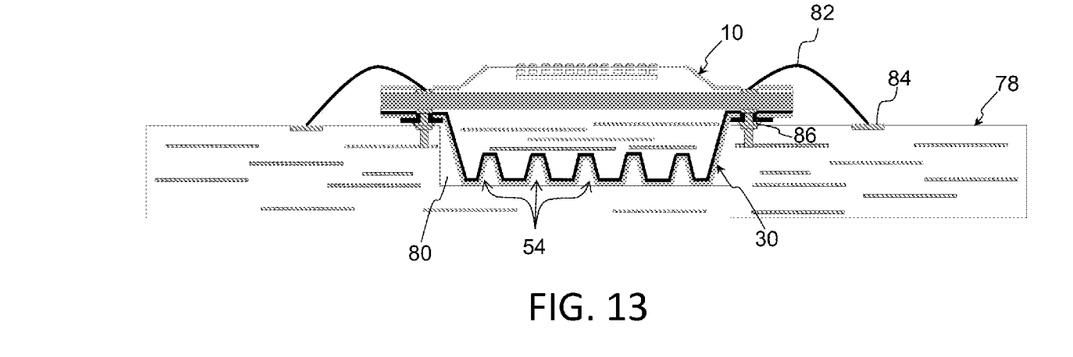

The diffusion layer 56 and metal layer 58 are formed on the bottom surface of substrate 32 (including inside trenches 54) as described above. Diffusion and metal layers 56/58 are selectively removed by the use of lithographic masking and plasma etching to expose the ASIC wafer bond pads 36. An insulation layer 76 is formed around bond pads 36 to protect against an electrical shorts to the conducive metal materials. The insulation layer 76 can be solder mask that is selectively formed around the bond pads 36. Preferably the insulation is deposited by spray coating, followed by a lithographic process to selectively remove the insulation except for around the bond pads 36. The resulting structure is shown in FIG. 12.

Wafer level dicing/singulation of components is performed (e.g. with mechnical blade dicing equipment, laser cutting or any other apporiate processes) along scribe lines between active areas, resulting in separate sensor packages each containing a sensor wafer die with its own active area. The individual sensor packages can be mounted to a host device such as a printed circuit board (PCB) or a flex printed circuit board. The host (shown as a PCB 78) preferably includes an aperture, trench or cavity 80 in which the package at least partially sits. Wirebonds 82 are used to connect the sensor pads 24 to conductive pads 84 on the host PCB 78. The bond pads 36 of the ASIC die 30 are connected to other conductive pads 84 of host PCB 78 through ball grid array interconnects 86 (or any other flipchip interconnection). Finally, the protective tape is removed thus exposing the sensor active area, resulting in the structure shown in FIG. 13. Air flowing through the cooling tunnels 54 efficiently removes heat from the package (originating from the sensor wafer die 30 and flowing to the ASIC wafer die 10), given the expanded surface area of the bottom surface of the ASIC die 10 because of the cooling tunnels.

Figure 14:
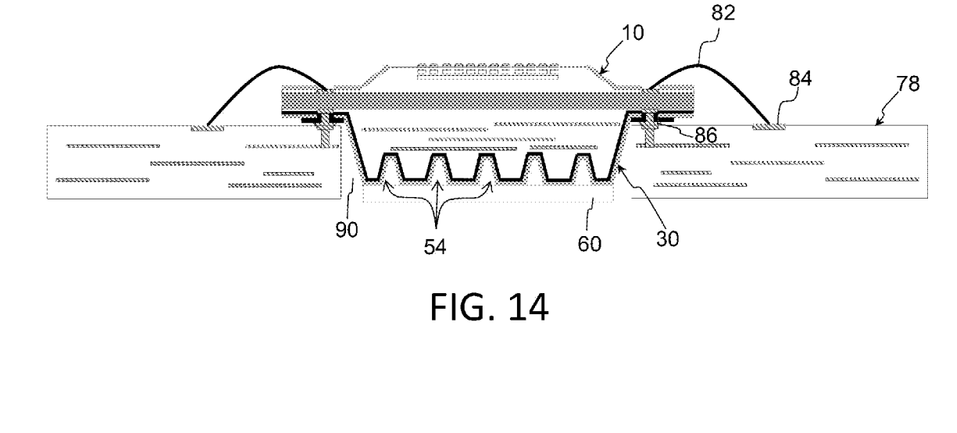
FIG. 14 is a side cross sectional view showing another alternate embodiment of the packaged sensor device with an integrated cooling solution.

FIG. 14 illustrates another alternate embodiment, in which PCB 78 includes a through hole 90 instead of cavity 80 in which the package at least partially sits. Substrate 60 as described above can be mounted to the bottom surface of the ASIC wafer substrate 32 so that cooling trenches 54 are cooling tunnels.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaged semiconductor device of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a sensor device, comprising:
providing a first substrate of semiconductor material that comprises:
opposing first and second surfaces,
a plurality of photodetectors configured to receive light impinging on the first surface, and
a plurality of first contact pads each electrically coupled to at least one of the plurality of photodetectors;
providing a second substrate that comprises:
opposing first and second surfaces,
electrical circuits, and
a plurality of second contact pads each electrically coupled to at least one of the electrical circuits;
forming a plurality of first trenches into the second surface of the second substrate but not reaching the first surface of the second substrate;
mounting the second surface of the first substrate to the first surface of the second substrate;
providing a third substrate that comprises:
opposing first and second surfaces,
a plurality of third contact pads disposed at the first surface of the third substrate, and
a plurality of fourth contact pads disposed at the first surface of the third substrate;
mounting the first surface of the third substrate to the second surface of the second substrate such that each of the second contact pads is electrically coupled to at least one of the third contact pads; and electrically connecting a plurality of wires between the first contact pads and the fourth contact pads.

2. The method of claim 1, further comprising:

forming a cavity into the first surface of the third substrate, wherein at least a portion of the second substrate is disposed in the cavity.

3. The method of claim 1, further comprising:

forming a through hole that extends between the first and second surfaces of the third substrate, wherein at least a portion of the second substrate is disposed in the through hole.

4. The method of claim 3, further comprising:

mounting a fourth substrate to the second surface of the second substrate, wherein the fourth substrate covers the first trenches.

5. The method of claim 1, further comprising:

forming one or more second trenches into the first surface of the first substrate, wherein the first plurality of contact pads are disposed in the one or more second trenches.

6. The method of claim 1, further comprising:

forming one or more second trenches into the second surface of the second substrate, wherein the second plurality of contact pads are disposed in the one or more second trenches.

* * * * *